United States Patent
Lin et al.

(10) Patent No.: US 10,847,349 B2
(45) Date of Patent: *Nov. 24, 2020

(54) MOVING FOCUS RING FOR PLASMA ETCHER

(71) Applicant: Taiwan Semiconductor Manufacturing Company, Ltd., Hsinchu (TW)

(72) Inventors: Yu-Chi Lin, Hsinchu (TW); Yi-Wei Chiu, Kaohsiung (TW); Hung Jui Chang, Shetou Shiang (TW); Chin-Hsing Lin, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,195

(22) Filed: Dec. 11, 2019

(65) Prior Publication Data

US 2020/0111649 A1    Apr. 9, 2020

Related U.S. Application Data

(63) Continuation of application No. 15/364,031, filed on Nov. 29, 2016, now Pat. No. 10,510,516.

(51) Int. Cl.
| | |
|---|---|
| *H01L 21/311* | (2006.01) |
| *H01J 37/32* | (2006.01) |
| *H01L 21/67* | (2006.01) |

(52) U.S. Cl.
CPC .. *H01J 37/32642* (2013.01); *H01J 37/32715* (2013.01); *H01L 21/31116* (2013.01); *H01L 21/31144* (2013.01); *H01L 21/67069* (2013.01); *H01J 2237/334* (2013.01)

(58) Field of Classification Search
CPC .................................................. H01L 21/31116
USPC ......................................................... 438/714
See application file for complete search history.

(56) References Cited

U.S. PATENT DOCUMENTS

| | | | |
|---|---|---|---|
| 5,213,658 | A | 5/1993 | Ishida |
| 6,210,593 | B1 | 4/2001 | Ohkuni et al. |
| 2002/0072240 | A1 | 6/2002 | Koike |
| 2003/0201069 | A1 | 10/2003 | Johnson |
| 2008/0286978 | A1 | 11/2008 | Chen et al. |
| 2017/0032987 | A1 | 2/2017 | Lee et al. |

*Primary Examiner* — Roberts P Culbert
(74) *Attorney, Agent, or Firm* — Slater Matsil, LLP

(57) ABSTRACT

A semiconductor manufacturing method and semiconductor manufacturing tool for performing the same are disclosed. The semiconductor manufacturing tool includes a plasma chamber, a mounting platform disposed within the plasma chamber, a focus ring disposed within the plasma chamber, and at least one actuator mechanically coupled to the focus ring and configured to move the focus ring vertically. The actuator is configured to move the focus ring vertically when a plasma is present in the plasma chamber.

20 Claims, 6 Drawing Sheets

MOVING FOCUS RING FOR PLASMA ETCHER

PRIORITY CLAIM AND CROSS-REFERENCE

This application is a continuation of U.S. patent application Ser. No. 15/364,031, filed on Nov. 29, 2016, and entitled "Moving Focus Ring for Plasma Etcher," which applications is incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
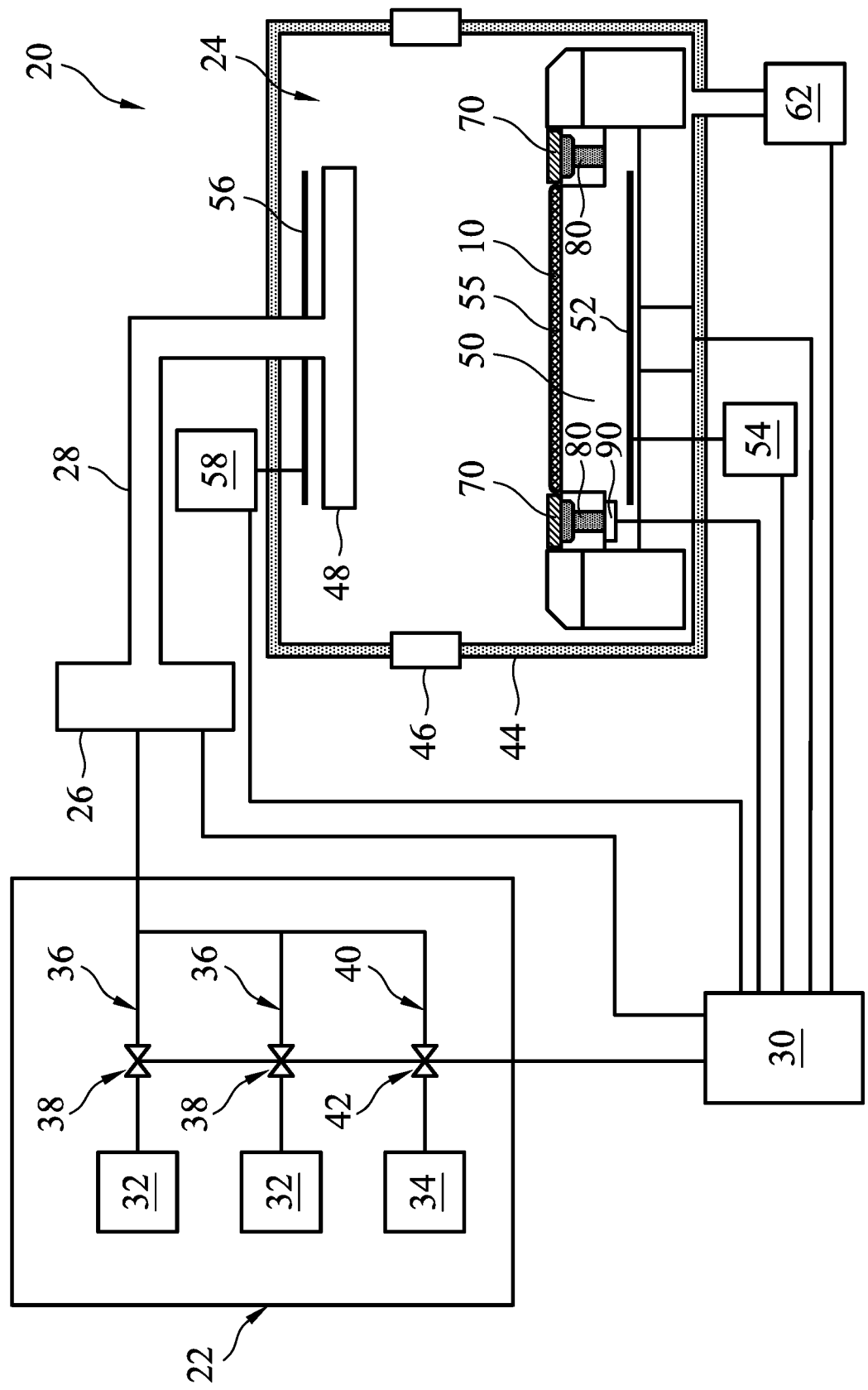
FIG. 1 illustrates an etching system and an etching process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A tool of manufacture for a semiconductor device is described in accordance with various embodiments. In particular, the tool of manufacture may be an etching system with a focus ring surrounding a wafer being processed. In some embodiments, the focus ring is configured to move vertically relative to the wafer during the etching process. Adjusting the vertical position of the focus ring may affect the etch rate of the etching process. In this manner, the etch rate of an etching process may be dynamically controlled during the etching process. Controlling the etch rate by moving the focus ring may allow improved control over the etching process. In some embodiments, the etch rate may be controlled to produce a desired etch profile. The etch rate may also be controlled in this manner to compensate for tool degradation.

FIG. 1 shows an example process to etch a surface of the semiconductor wafer 10 by placing the semiconductor wafer 10 into an etching system 20. In an embodiment the etching system 20 includes an etchant delivery system 22 that may deliver one or more gaseous etchants to an etching chamber 24. The etchant delivery system 22 supplies the various desired etchants to the etching chamber 24 through an etchant controller 26 and a manifold 28. The etchant delivery system 22 may also help to control the flow rate of the etchant or etchants into the etching chamber 24 by controlling the flow and pressure of a carrier gas through the etchant delivery system 22. The etchant delivery system 22 and the etching chamber 24 are controlled by a controller 30, which controls and regulates the introduction of various etchants and carrier gases to the etching chamber 24. In some embodiments, the etching process performed by etching system 20 may be a reactive-ion etching (RIE) or deep reactive-ion etching (DRIE) process.

In an embodiment the etchant delivery system 22 may include a plurality of etchant suppliers 32 along with a carrier gas supply 34. Although only two of the etchant suppliers 32 are illustrated in FIG. 1, this is done merely for clarity, and it should be appreciated that any suitable number of etchant suppliers 32 may be included, such as one etchant supplier for each etchant desired to be used within the etching system 20. For example, in an embodiment in which five separate etchants will be utilized, there may be five of the etchant suppliers 32.

Each of the etchant suppliers 32 may be a vessel, such as a gas storage tank, that is located either locally to the etching chamber 24 or remotely from the etching chamber 24. In another embodiment, the etchant suppliers 32 may be part of a facility that independently prepares and delivers the desired etchants. Any suitable source for the desired etchants may be utilized as the etchant suppliers 32, and all such sources are fully intended to be included within the scope of the embodiments. Each of the etchant suppliers 32 supply an etchant to the etchant controller 26 through first lines 36 with first valves 38. The first valves 38 are controlled by the controller 30.

A carrier gas supply 34 may supply a desired carrier gas, or diluent gas, that may be used to help push or "carry" the various desired etchants to the etching chamber 24. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may be utilized.

The carrier gas supply 34, or diluent supply, may be a vessel, such as a gas storage tank, that is located either locally to the etching chamber 24 or remotely from the etching chamber 24. In another embodiment, the carrier gas supply 34 may be a facility that independently prepares and delivers the carrier gas to the etchant controller 26. Any suitable source for the carrier gas may be utilized as the carrier gas supply 34, and all such sources are fully intended to be included within the scope of the embodiments. The carrier gas supply 34 may supply the desired carrier gas to the etchant controller 26 through a second line 40 with a second valve 42 that connects the carrier gas supply 34 to the first lines 36. The second valve 42 is also controlled by the controller 30 that controls and regulates the introduction of the various etchants and carrier gases to the etching chamber 24. Once combined, the lines may be directed towards the etchant controller 26, for a controlled entry into the etching chamber 24 through the manifold 28.

In some cases, one or more of the etchant suppliers 32 may be separately connected to the etchant controller 26 through first lines 36 with first valves 38. The carrier gas supply 34 may also be connected separately to the etchant controller 26 through a second line 40 with a second valve 42. In this manner, etchants from the etchant suppliers 32 and the carrier gas from the carrier gas supply 34 may be supplied to the etchant controller 26 individually, in combination, or in sequence. Etchants and the carrier gas may be combined in the etchant controller 26 before being supplied to the manifold 28.

The etching chamber 24 may be any desired shape suitable for dispersing the etchant and contacting the etchant with the semiconductor wafer 10. In the embodiment illustrated in FIG. 1, the etching chamber 24 has a cylindrical sidewall and a bottom. However, the etching chamber 24 is not limited to a cylindrical shape, and any other suitable shape, such as a hollow square tube, an octagonal shape, or the like, may be utilized. Furthermore, the etching chamber 24 may be surrounded by an etchant chamber housing 44 made of material that is inert to the various process materials. As such, although the etchant chamber housing 44 may be any suitable material that can withstand the chemistries and pressures involved in the etching process, in an embodiment the etchant chamber housing 44 may be steel, stainless steel, nickel, aluminum, alloys of these, combinations of these, and the like. In some embodiments, spacers 46 may be inserted and removed from sidewalls of the etchant chamber housing 44 to control the height of the etching chamber 24.

The etching chamber 24 includes a showerhead 48. In an embodiment the showerhead 48 receives the various etchants from the manifold 28 and helps to disperse the various etchants into the etching chamber 24. The showerhead 48 may be designed to evenly disperse the etchants in order to minimize undesired process conditions that may arise from uneven dispersal. In an embodiment the showerhead 48 may have a circular design with openings dispersed evenly around the showerhead 48 to allow for the dispersal of the desired etchants into the etching chamber 24. However, any suitable method of introducing the desired etchants, such as entry ports, may be utilized to introduce the desired etchants into the etching chamber 24.

Within the etching chamber 24 is located a mounting platform 50 in order to position and control the semiconductor wafer 10 during the etching process. In some cases, the semiconductor wafer 10 may be mounted onto a mounting surface 55 of the mounting platform 50. The mounting platform 50 may hold the semiconductor wafer 10 using electrostatic forces, clamps, vacuum pressure, combinations of these, or the like, and may also include heating and cooling mechanisms in order to control the temperature of the semiconductor wafer 10 during the processes.

In some embodiments, the etching chamber 24 and the mounting platform 50 may be part of a cluster tool system (not shown). The cluster tool system may be used in conjunction with an automated handling system in order to position and place the semiconductor wafer 10 into the etching chamber 24 prior to the etching process, position and hold the semiconductor wafer 10 during the etching processes, and remove the semiconductor wafer 10 from the etching chamber 24 after the etching processes.

The mounting platform 50 also includes a focus ring 70 mounted on a focus ring holder 80. The focus ring 70 surrounds the wafer 10 and may have a generally annular shape. The focus ring 70 may have a rectangular cross-section as shown in FIG. 1, or may have an irregular cross-section or a cross-section of a different shape. The focus ring 70 may have a thickness of between about 2.5 mm and 8 mm, such as about 3.4 mm. However, any suitable dimensions or suitable shapes may be used. The focus ring 70 may be made of a conductive material, a semiconductor material, a dielectric material, or another material. In some embodiments, the focus ring 70 may be made of doped or undoped silicon.

The focus ring 70 is mounted to the focus ring holder 80. The focus ring holder 80 may support or hold the focus ring 70 around an entire circumference of the focus ring 70 or may support or hold the focus ring 70 at one or more separate locations on the focus ring 70. In some embodiments, the focus ring holder 80 is part of the mounting platform 50. In some embodiments, the focus ring holder 80 is part of the chamber housing 44 or part of another component of the etching system 20. The focus ring holder 80 is connected to one or more actuators 90 that are configured to move the focus ring 70 vertically. In some embodiments, the actuator 90 may be part of or separate from the focus ring holder 80 or the mounting platform 50. In some embodiments, the actuator 90 may be internal to or external to the chamber housing 44. To move the focus ring 70, the actuator 90 may include, for example, a stepper motor or another type of motor, or a hydraulic system. In some embodiments, the actuator 90 may move a movable part of the focus ring holder 80 directly, or may be connected to the focus ring holder 80 by linkages, gearing, cables, hydraulics, or another suitable technique or combination of techniques. The actuator 90 is controlled by the controller 30. In an embodiment the actuator 90 is utilized to control the vertical position of the focus ring 70 during the etching process, as the vertical position of the focus ring 70 can affect characteristics of the etching process such as the etch rate. The actuator 90 may move the focus ring 70 before, during, or after the etching process. For example, the actuator may move the focus ring 70 during etching of the wafer 10, or during loading or unloading of the wafer 10. The actuator 90 may also maintain a vertical position of the focus ring 70 for a duration of time. In some embodiments the actuator 90 may move the focus ring 70 between two or more vertical positions before, during, or after the etching process. In some embodiments the actuator 90 may move the focus ring 70 in an upward direction and/or in a downward direction before, during, or after the etching process. In some embodiments the actuator 90 may move the focus ring 70 at one or more different speeds and/or at one or more different accelerations before, during, or after the etching process. In some embodiments the actuator 90 may continuously move the focus ring 70 during the entire etching process or during a portion of the etching process.

Figure 2A:
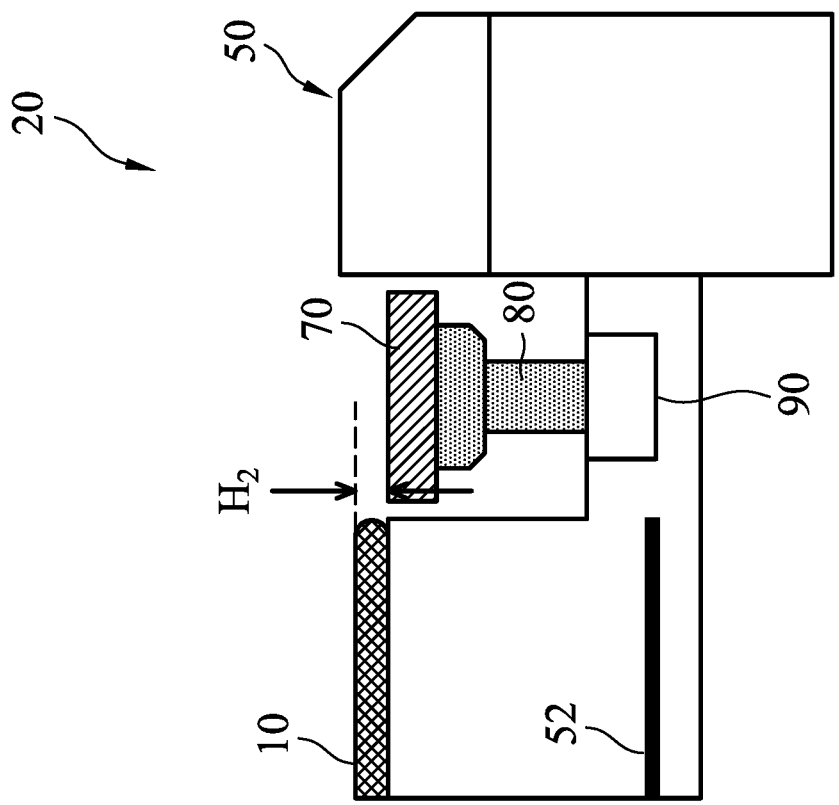
FIGS. 2A-2B illustrate an etching system and an etching process in accordance with some embodiments.
Figure 2B:
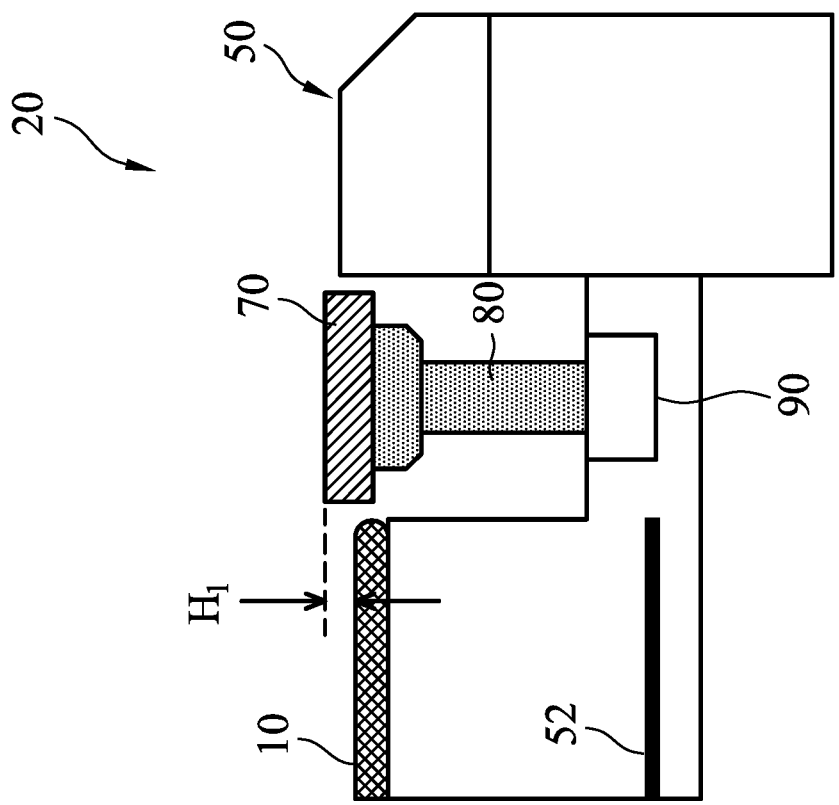

Turning to FIG. 2A and FIG. 2B, FIGS. 2A-2B illustrate embodiments of the etching system 20 including example vertical positions of the focus ring 70. In FIG. 2A, the actuator 90 has moved focus ring 70 at height $H_1$ above the top surface of the wafer 10. In FIG. 2B, the actuator 90 has moved focus ring 70 to a height $H_2$ below the top surface of the wafer 10. FIGS. 2A-2B may show focus ring 70 at heights H1 and H2 during an etching process, for example, while a plasma is present in the etching chamber 24. Alternatively, FIGS. 2A-2B may show focus ring 70 at heights H1 and H2 prior to or after the etching process, for example, prior to plasma generation or after plasma cessation. In an embodiment, the focus ring 70 may be moved to a height H1 between about 0 mm and about 5 mm above the wafer 10, such as about 2 mm. In an embodiment, the focus ring 70 may be moved to a height H2 between about 0 mm and about 5 mm below the wafer 10, such as about 2 mm. The focus ring 70 may have a vertical movement range such as 5 mm, 10 mm, 50 mm, or another distance. These are examples; other heights and distances are within the scope of this disclosure.

Returning to FIG. 1, the etching chamber 24 also includes a lower electrode 52 coupled to a lower RF generator 54. The lower electrode 52 may be electrically biased by the lower RF generator 54 (under control of the controller 30) at a RF voltage during the etching process. By being electrically biased, the lower electrode 52 is used to provide a bias to the incoming etchants and assist to ignite them into a plasma. The lower electrode 52 is also utilized to maintain the plasma during the etching process by maintaining the bias and also to help accelerate ions from the plasma towards the semiconductor wafer 10. In some embodiments, the focus ring 70 or focus ring holder 80 may be either coupled to the lower electrode 52 or else be electrically isolated from the lower electrode 52.

The etching chamber 24 also includes an upper electrode 56 coupled to an upper RF generator 58, for use as a plasma generator. In an embodiment the plasma generator may be a transformer coupled plasma generator and may be, e.g., a coil. The upper RF generator 58 provides power to the upper electrode 56 (under control of the controller 30) in order to ignite the plasma during introduction of the reactive etchants.

Although the upper electrode 56 is described above as a capacitively coupled plasma generator, embodiments are not intended to be limited to a capacitively coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

The etching chamber 24 may also be connected to a vacuum pump 62. In an embodiment the vacuum pump 62 is under the control of the controller 30, and may be utilized to control the pressure within the etching chamber 24 to a desired pressure. Additionally, once the etching process is completed, the vacuum pump 62 may be utilized to evacuate the etching chamber 24 in preparation for removal of the semiconductor wafer 10.

Although a number of particular parts of the etching system 20 have been described above, other suitable parts may also be included. For example, endpoint mounts, liners, and any other parts that may help operate or control the etching process may also be included. All such parts are fully intended to be included within the scope of the embodiments.

Embodiments within the disclosure describe controlling the vertical position of a focus ring in an etching chamber. Changing the vertical position of the focus ring can change the shape of the plasma formed during an etching process, and changing the shape of the plasma can change the characteristics of the etching process. In some cases, the changed etch characteristics may include the etch rate, the etch anisotropy, the etch selectivity, or other characteristics. In some cases, changing the plasma shape may also change other characteristics of the plasma including a density of a portion of the plasma, a composition of a portion of the plasma, a proportion of materials within a portion of the plasma, or other characteristics. For example, the density of a portion of the plasma near the wafer may be increased or decreased by changing the focus ring position, which can change etch characteristics of that portion of the plasma.

Figure 3:
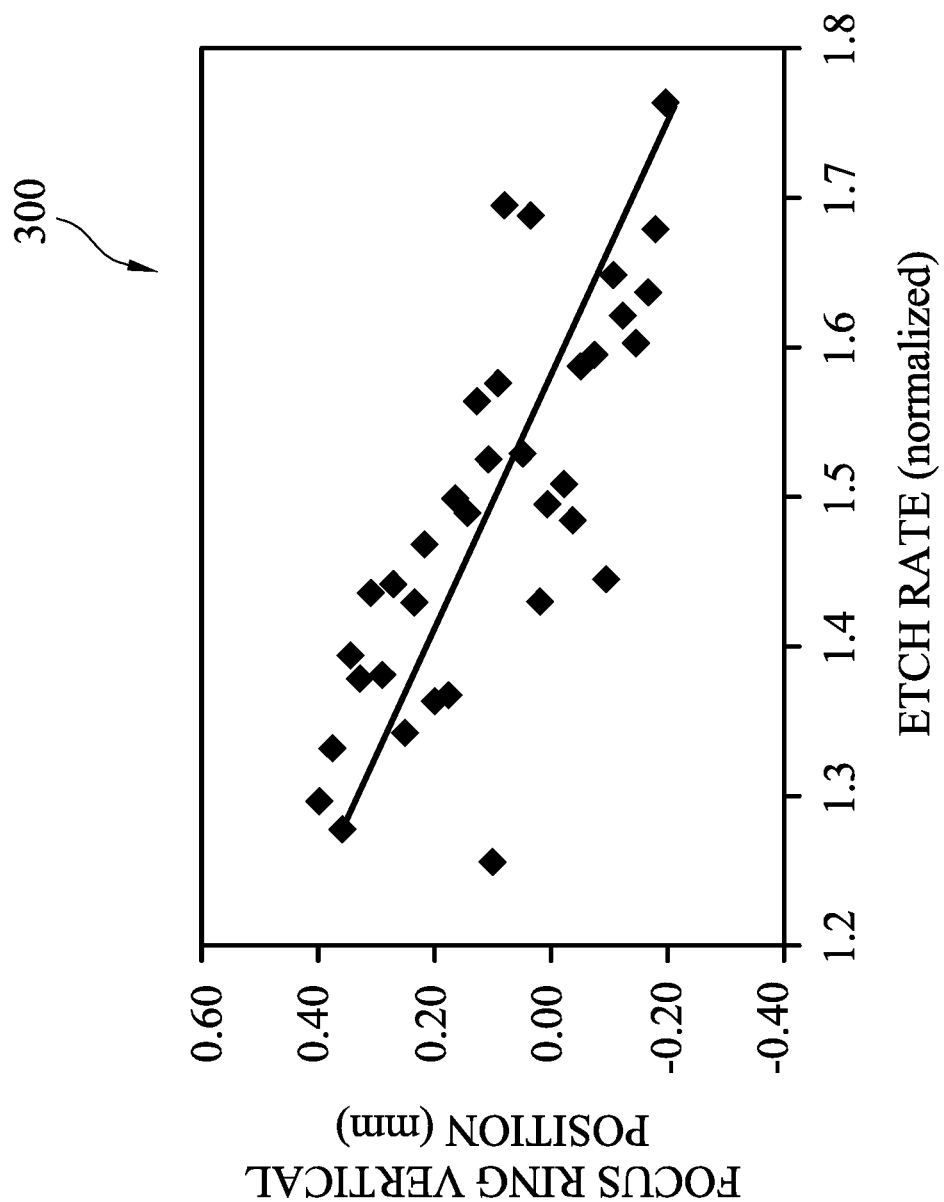
FIG. 3 illustrates an example plot of focus ring position versus etch rate in accordance with some embodiments.

As an illustrative example, FIG. 3 shows a plot 300 of a normalized etch rate vs. focus ring vertical position for an etching process. The vertical position of the focus ring on the y-axis is measured in mm relative to an arbitrary reference position. As FIG. 3 shows, in this example etching process, a lower focus ring position corresponds in general to a faster etch rate, and a higher focus ring position corresponds in general to a slower etch rate. For example, the configuration with a higher focus ring position shown in FIG. 2A would have a faster etch rate than the configuration with a lower focus ring position shown in FIG. 2B. Other embodiments, configurations, and conditions may have different relationships between focus ring vertical position and etch rate than the example shown in FIG. 3 and are within the scope of this disclosure.

In some embodiments, the controller (e.g., controller 30 shown in FIG. 1) may control the vertical position of the focus ring based in part on the thickness of the focus ring. For example, the controller may determine a lower vertical position of the focus ring holder to compensate for a thicker focus ring, or a higher vertical position of the focus ring holder to compensate for a thinner focus ring. In this manner, focus rings of different thicknesses can be positioned at the same height above the wafer to have a similar etch rate. Moreover, a focus ring may become thinner over time as it is used, and the controller can compensate for the thinning focus ring to maintain an expected etch rate over time.

Figure 4B:
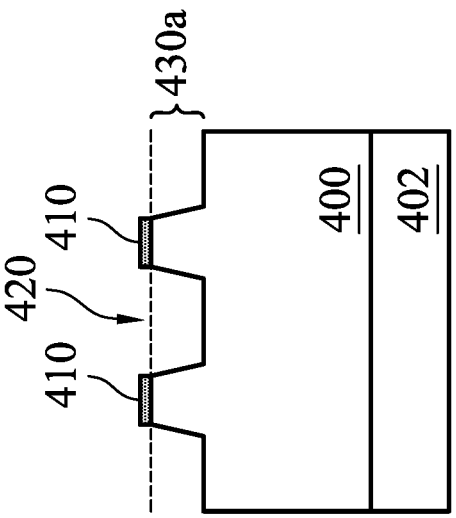
FIGS. 4A-4D illustrate an etching process in accordance with some embodiments.
Figure 4D:
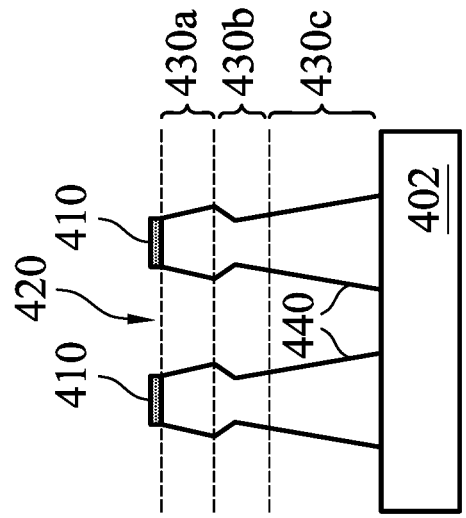
Figure 4A:
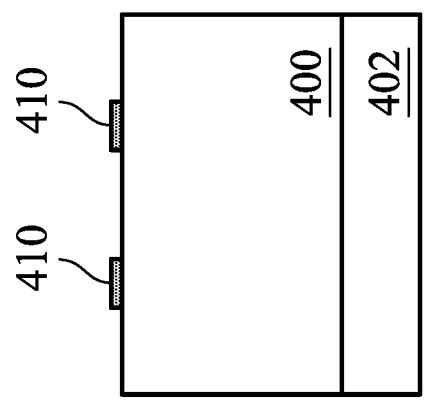
Figure 4C:
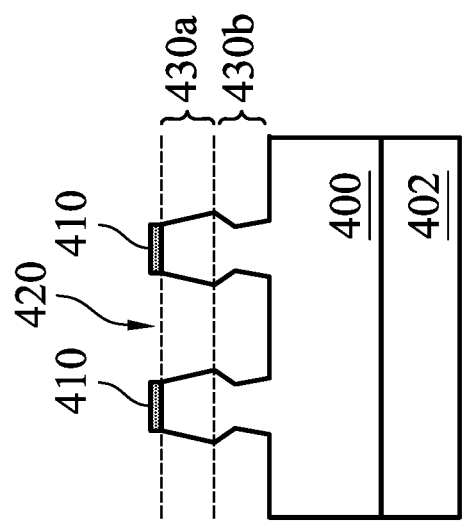

Dynamically controlling the vertical position of the focus ring during the etching process can enable increased control of the etching process. In some embodiments, the vertical position of the focus ring can be controlled during the etching process to produce a desired etch profile or other desired etch characteristics. As an illustrative example, FIGS. 4A-4D shows the etching of a trench 420 into a layer 400. The etching can be performed using a plasma etcher such as etching system 20 shown in FIG. 1. FIG. 4A shows a hardmask 410 patterned on an unetched layer 400. The layer 400 may be, for example, a silicon oxide layer or dielectric material, although other layer materials or combinations of materials may be used as known in the art. FIGS. 4A-4D show layer 400 disposed over a layer 402. Layer 402 may be a dielectric material, semiconductor material, or other materials or combinations of materials as known in the art, including the same material as layer 400. In some cases layer 402 may be part of layer 400. FIG. 4B shows the layer 400 after a first etched portion 430a has been etched. In this example, first etched portion 430a is etched with the focus ring at a first vertical position corresponding to a slower etch rate. FIG. 4C shows the layer 400 after a second etched portion 430b has been etched. The second etched portion 430b is etched after moving the focus ring to a second vertical position corresponding to a faster etch rate. Due to the faster etch rate, the trench 420 is wider in the second etched portion 430b than in the first etched portion 430a. FIG. 4D shows the layer 400 after a third etched portion 430c has been etched. FIG. 4D shows the third etched portion 430c as having a bottom surface about at the top surface of layer 402, but in some cases the third etched portion 430c may have a bottom surface above or below the top surface of layer 402. The third etched portion 430c is etched after moving the focus ring back to a third vertical position corresponding to a slower etch rate. The vertical position of the focus ring used for the third etched portion 430c may or may not be the same as that used for the first etched portion 430a. By dynamically adjusting the vertical position of the focus ring during the etching process, the sidewalls 440 of trench 420 have been formed with a desired "vase-shaped" profile.

Figure 5B:
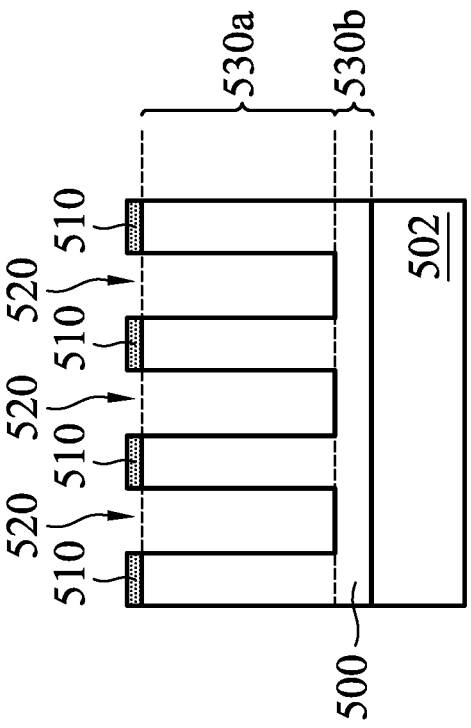
FIGS. 5A-5E illustrate an etching process in accordance with some embodiments.
Figure 5A:
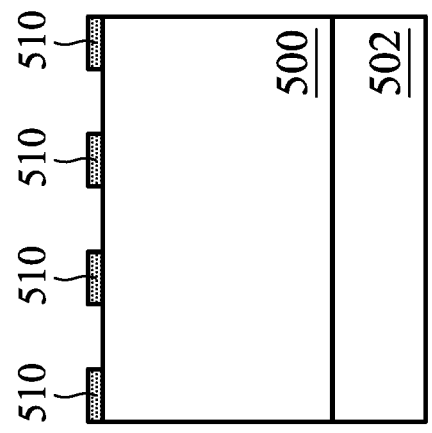
Figure 5D:
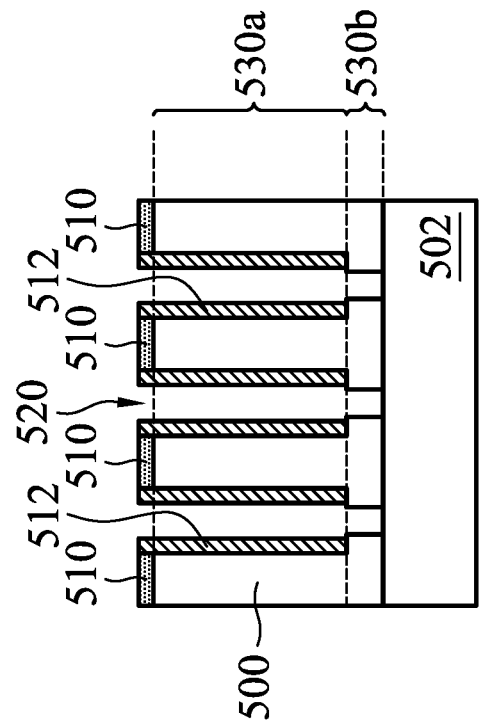
Figure 5C:
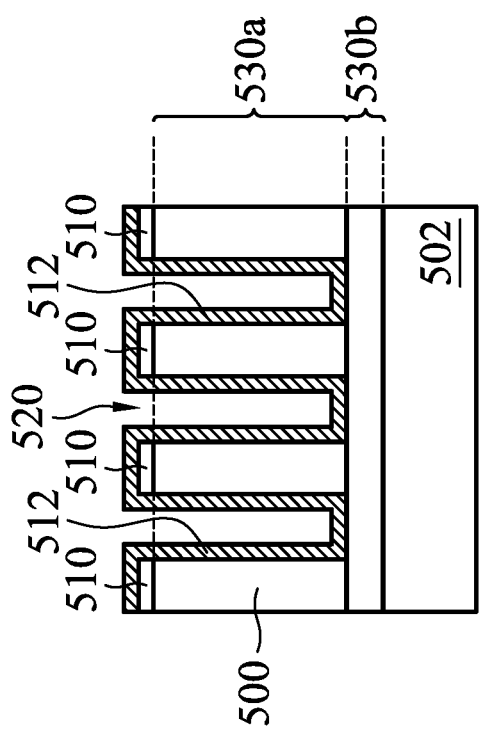

Another illustrative example of etch control is shown in FIGS. 5A-5C. FIGS. 5A-5E show the etching of trenches 520 into a layer 500. The etching can be performed using a plasma etcher such as etching system 20 shown in FIG. 1. FIG. 5A shows a hardmask 510 patterned on an unetched layer 500. The layer 500 may be, for example, a silicon oxide layer or other dielectric material, although other layer materials or combinations of materials may be used as known in the art. FIGS. 5A-5C show layer 500 disposed over a layer 502. Layer 502 may be a dielectric material, semiconductor material, or other materials or combinations of materials as known in the art, including the same material as layer 500. In some cases layer 502 may be part of layer 500. FIG. 5B shows the layer 500 after a first etched portion 530a of trenches 520 has been etched. In this example, first etched portion 530a is etched with the focus ring at a first vertical position corresponding to a first etch rate or first selectivity.

FIG. 5C shows the layer 500 after a passivation layer 512 has been deposited on the sidewalls and bottom surface of trenches 520. In some embodiments, the passivation layer 512 is a dielectric material such as a semiconductor oxide, a polymer, or another material. The passivation layer 512 may be deposited using the etching system (e.g., etching system 20). In some cases, the passivation layer 512 is deposited as part of a DRIE process. The vertical position of the focus ring may be adjusted before, during, or after the deposition of the passivation layer 512.

FIG. 5D shows the layer 500 after a second etched portion 530b has been etched. In some cases, the passivation layer 512 may be etched after moving the focus ring to a second vertical position corresponding to a second etch rate or second selectivity. For example, the passivation layer 512 may be etched anisotropically such that the passivation layer 512 disposed on the bottom surface of trenches 520 is removed, but at least some of the passivation layer 512 disposed on the sidewalls of trenches 520 remains. In some cases, the second etched portion 530b may then be etched after moving the focus ring to a third vertical position corresponding to a third etch rate or third selectivity. In some cases, the vertical position of the focus ring may be adjusted to provide a specific etch anisotropy for a specific part of the process. FIG. 5D shows the second etched portion 530b as having a bottom surface about at the top surface of layer 502, but in some cases the second etched portion 530b may have a bottom surface above or below the top surface of layer 502.

Figure 5E:
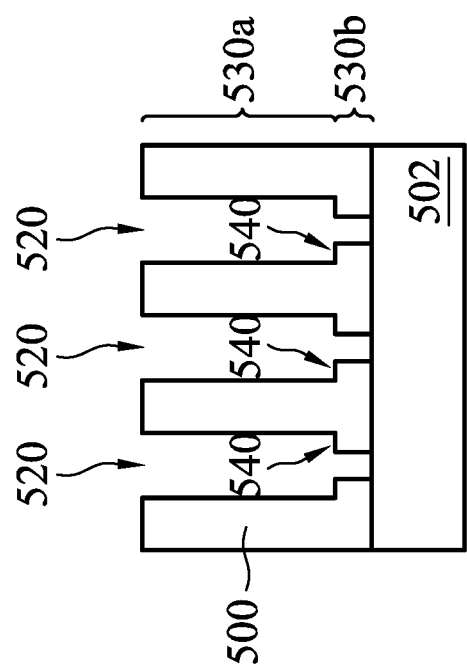

FIG. 5E shows the layer 500 after the hardmask 510 and passivation layer 512 has been removed. As shown in FIG. 5E, the trenches 520 are narrower in the second etched portion 530b than in the first etched portion 530a, forming step features 540. By dynamically adjusting the vertical position of the focus ring during the etching process, the trenches 520 have been formed with a desired profile including step features 540.

In some embodiments, changing the vertical position of the focus ring also changes the etch selectivity between the layer 500 material and the layer 502 material. An increased etch selectivity may reduce the amount of layer 502 that is removed during etching of the second etched portion 530b. In this manner, the bottom of trench 520 may have a flatter bottom surface, and the step features 540 of each trench 520 may be more well-defined. Additionally, the increased selectivity may improve etch reliability or predictability, such as reducing the chance of overetching the second etched portion 530b.

In some embodiments, changing the vertical position of the focus ring also changes the etch selectivity between the layer 500 material and the passivation 512 material. An increased etch selectivity may reduce the amount of passivation layer 512 that is removed from the sidewalls of trenches 520 during etching of the second etched portion 530b. In this manner, the sidewalls of trench 520 may be better protected from etching, and the step features 540 of each trench 520 may be more well-defined. Additionally, the increased selectivity may improve etch reliability or predictability, such as reducing the chance of overetching the passivation layer 512 or the second etched portion 530b.

In other embodiments, the focus ring may be adjusted more or fewer times or may be adjusted in a different manner than described. In other cases, other sidewall profiles may be formed. In this manner, controlling the vertical position of the focus ring can facilitate etching a region with a desired shape, profile, depth, width, area, or other characteristics. In addition to the vertical position of the focus ring, other parameters of the etching process may be controlled during the etching process, such as electrode power or voltage, composition or type of etchants, etchant flow rate, etc. The processes shown in FIGS. 4A-4C and in Figures SA-SE are intended as illustrative examples, and other processes using an adjustable focus ring may include more, fewer, or different steps. All such embodiments are fully intended to be included within the scope of this disclosure. Moreover, while the etching tools and processes have been described above with respect to an etching of a trench in a layer, these descriptions of these embodiments are not intended to limit the embodiments to this description. Rather, the processes described above could be applied to any suitable plasma etching process.

Controlling the vertical position of the focus ring can allow more control over the etching process. For example, the etch rate of an etching process can be controlled by controlling the vertical position of the focus ring. As another example, the selectivity of an etch process can be controlled by controlling the vertical position of the focus ring. By using the tools and processes described herein, a desired etch profile may be achieved. The vertical position of the focus ring can be controlled and modified during etching. Additionally, controlling the vertical position of a focus ring can help to reduce or eliminate problems related to degradation or thinning of the focus ring.

According to an embodiment, a method includes placing a wafer within a plasma chamber, moving a focus ring within the plasma chamber from a first vertical position relative to the wafer to a second vertical position relative to the wafer, wherein the first vertical position and the second vertical position are different plasma etch positions, and forming a plasma within the plasma chamber.

According to an embodiment, a plasma etching method includes mounting a wafer on a mounting surface of a mounting platform disposed within a plasma chamber, the mounting platform including a movable focus ring, etching portions of the wafer, and moving the focus ring vertically relative to the mounting surface while portions of the wafer are being etched.

According to an embodiment, a semiconductor manufacturing tool includes a plasma chamber, a mounting platform disposed within the plasma chamber, a focus ring disposed within the plasma chamber, and at least one actuator mechanically coupled to the focus ring and configured to move the focus ring vertically.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a first layer of a wafer in a plasma chamber to form a recess in the first layer using a first plasma process, wherein the first layer is a single layer, and the recess exposes first sidewalls of the first layer; and
    moving a focus ring within the plasma chamber from a first vertical position relative to the wafer to a second vertical position relative to the wafer during the first plasma process, wherein the first vertical position and the second vertical position are different plasma etch positions, the first vertical position corresponds to a first etch rate for the first plasma process, and the second vertical position corresponds to a second etch rate for the first plasma process different from the first etch rate, wherein moving the focus ring during the first plasma process produces a non-linear sidewall profile for the first sidewalls of the first layer, wherein the first sidewalls of the first layer comprises a first portion and a second portion underlying the first portion, the first portion and the second portion having different sidewall profiles.

2. The method of claim 1, wherein a first distance between first opposing sidewalls of the first portion decreases continuously along a first direction from a top of the recess toward a bottom of the recess, and a second distance between second opposing sidewalls of the second portion increases continuously along the first direction.

3. The method of claim 2, further comprising, after moving the focus ring to the second vertical position, moving the focus ring to a third vertical position relative to the wafer during the first plasma process, the third vertical position being different from the second vertical position and corresponding to a third etch rate different from the second etch rate, wherein the first sidewalls of the first layer further comprises a third portion underlying the second portion, wherein a third distance between third opposing sidewalls of the third portion decreases continuously along the first direction.

4. The method of claim 2, wherein moving the focus ring comprises moving a focus ring holder that supports the focus ring.

5. The method of claim 4, wherein moving the focus ring holder comprises controlling an actuator mechanically coupled to the focus ring holder.

6. The method of claim 1, wherein the first vertical position is further from the wafer than the second vertical position, and the first etch rate is slower than the second etch rate.

7. The method of claim 1, further comprising adjusting a vertical position of the focus ring to compensate for wear and tear of the focus ring.

8. The method of claim 7, wherein adjusting the vertical position of the focus ring comprises:
    increasing a distance between the focus ring and the wafer when a thickness of the focus ring is reduced; and
    decreasing the distance between the focus ring and the wafer when the thickness of the focus ring is increased.

9. The method of claim 1, wherein moving the focus ring comprises moving the focus ring continuously throughout an entire process of the first plasma process such that the first plasma process has a continuously changing etch rate throughout the entire process of the first plasma process.

10. The method of claim 9, wherein after the first plasma process, a width between the first sidewalls of the first layer changes continuously from a top of the recess to a bottom of the recess.

11. A method comprising:
    mounting a wafer on a mounting surface of a mounting platform disposed within a plasma chamber, the mounting platform comprising a focus ring that is movable;
    etching an upper portion of a first layer of the wafer at a first etch rate to form a first recess in the first layer while the focus ring is at a first vertical position relative to the mounting surface, the first layer comprising a same material that extends continuously from a first surface of the first layer facing the mounting surface to a second surface of the first layer opposing the first surface;
    depositing a passivation layer lining sidewalls and a bottom of the first recess, wherein depositing the passivation layer comprises changing a vertical distance between the focus ring and the mounting surface while the passivation layer is being deposited;
    removing a bottom portion of the passivation layer disposed at the bottom of the first recess, wherein the sidewalls of the first recess are covered by the passivation layer after removing the bottom portion of the passivation layer;
    moving the focus ring to a second vertical position relative to the mounting surface after removing the bottom portion of the passivation layer, wherein the first vertical position and the second vertical position are different vertical positions; and etching a lower portion of the first layer of the wafer at a second etch rate to form a second recess underlying the first recess while the sidewalls of the first recess are covered by the passivation layer, wherein the first etch rate and the second etch rate are different.

12. The method of claim 11, wherein the focus ring is mechanically coupled to the mounting platform.

13. The method of claim 12, wherein the focus ring is mechanically coupled to a focus ring holder of the mounting platform, wherein moving the focus ring comprises controlling an actuator that is mechanically coupled to the focus ring holder.

14. The method of claim 12, further comprising adjusting a distance between the focus ring and the mounting surface based on a thickness of the focus ring.

15. The method of claim 11, further comprising, after depositing the passivation layer and before removing the bottom portion of the passivation layer, moving the focus ring to a third vertical position relative to the mounting surface, the third vertical position being different from the first vertical position and the second vertical position, wherein removing the bottom portion of the passivation layer is performed while the focus ring is at the third vertical position.

16. The method of claim 11, wherein the second recess is formed to have a second width smaller than a first width of the first recess.

17. A method comprising:
   mounting a substrate on a platform in a plasma chamber, the plasma chamber comprising a movable focus ring; and
   etching a recess in the substrate, the etching comprising:
      etching a first portion of a first layer of the substrate using a first plasma etching process, wherein the first layer is a single layer, wherein the movable focus ring is at a first distance from the substrate during the first plasma etching process; and
      etching a second portion of the first layer of the substrate using a second plasma etching process, wherein the movable focus ring is at a second distance from the substrate during the second plasma etching process, wherein the second distance is different from the first distance, and a first etch rate of the first plasma etching process is different from a second etch rate of the second plasma etching process,
   wherein sidewalls of the recess comprise a plurality of slanted segments that form different angles with an upper surface of the platform.

18. The method of claim 17, wherein the recess comprises a first portion distal from the platform and comprises a second portion between the first portion and the platform, wherein a first width of the first portion of the recess decreases continuously as the first portion extends toward the platform, and a second width of the second portion of the recess increases continuously as the second portion extends toward the platform.

19. The method of claim 18, further comprising supporting the movable focus ring with a supporter.

20. The method of claim 19, further comprising controlling an actuator that is mechanically coupled to the supporter to change a distance between the movable focus ring and the substrate.

* * * * *